United States Patent [19]

Goodson

[11] Patent Number: 4,683,422

[45] Date of Patent: Jul. 28, 1987

[54] LOW VOLTAGE CONTINUITY TESTER

[76] Inventor: David R. Goodson, 28267 Tahoe Ct., Hayward, Calif. 94545

[21] Appl. No.: 778,145

[22] Filed: Sep. 20, 1985

[51] Int. Cl.$^4$ ............................................. G01R 31/08
[52] U.S. Cl. ...................................... 324/133; 324/62; 324/65 R
[58] Field of Search ................... 324/51, 52, 133, 62, 324/65 R; 340/650-652

[56] References Cited

U.S. PATENT DOCUMENTS 3,919,631 11/1975 Brown .
4,163,937 8/1979 Laass .
4,233,560 11/1980 Blenman ............................. 324/133
4,580,091 4/1986 Robinson ............................. 324/51

FOREIGN PATENT DOCUMENTS 2851451 6/1979 Fed. Rep. of Germany ...... 324/133
1017251 1/1966 United Kingdom ................ 324/133

OTHER PUBLICATIONS

Logan: "Test Probe . . . " Electronic Design—Feb. 1, 1977, p. 72.
Longborg: "Continuity/Isolation Checker"-JPL Report NPO-15632, Winter 1983.
Cockrum: "Analysis of a Diode-Protected Failure'-'—Electronic Test, May 1985—pp. 33-35.

Primary Examiner—Gerard R. Strecker
Assistant Examiner—Jose M. Solis

[57] ABSTRACT

A continuity tester specifically for tracing wiring and circuit paths on electronic printed circuit board assemblies that will not harm semiconductors or respond to resistances of more than a few ohms. The invention electronically divides the probe voltage down to less than 0.25 volts so that semiconductors cannot be biased into conduction when probed resulting in zero induced test current through them. A low impedance input responses to low resistance wiring continuity only, eliminating false responses that can be caused by measuring through a component. A grounding means is provided to prevent damage from static electric discharges by connecting the probes through a high value resistor to workstation ground.

9 Claims, 2 Drawing Figures

LOW VOLTAGE CONTINUITY TESTER

BACKGROUND OF THE INVENTION

Continuity testing and the associated continuity testers have been in common use for many years. During this time, continuity testers evolved from simple battery and buzzer/lamp devices with test leads into smaller sizes through the use of transistors, electronic oscillators and light emitting diodes. These improvements eliminated the high voltage spikes and current surges associated with the older buzzer/lamp testers making them suitable and safe for tracing wiring and testing diodes and transistors on electronic printed circuit board assemblies. With the advent of the integrated circuit, the discret components on the printed circuit boards virtually disappeared making it no longer possible for a continuity tester to perform any component testing. However, the integrated circuit brought about a new role for the continuity tester: with the increasing complexity caused by cramming more and more functions into less space, the need arose to verify the point to point wiring connections to each integrated circuit pin. On a bare printed wiring board, this task can be done with any type of continuity tester, but the majority of industrial testing involves circuit boards that already have their integrated circuits soldered in place along with numerous circuit cuts and added jumper wires. To complicate matters, a new type of integrated circuit was developed called Complementary Metal Oxide Semiconductor, referred to in the trade as simply CMOS. CMOS offered higher circuit density by operating at significantly lower power levels, but not without a price- the CMOS semiconductor construction is so thin that a relatively low current flow misapplied would destroy it. Even the current from a static electric discharge of only a few hundred volts generated by a person's clothing was too much. Operator workstations for handling CMOS required elaborate grounding devices such as wrist straps, conductive bench tops and ionizing air blowers to eliminate and dissipate all static electric fields. Another generation of continuity testers evolved to prevent damage to CMOS devices by increasing their impedance so high that only microamperes of current were induced into the circuit being probed, but because of their high impedance, they could not distinguish the difference between a wiring path, a semiconductor junction, or a high value resistor which greatly limited their usefulness. Ideally, a continuity tester for tracing electronic wiring circuit paths without erroneous readings must meet 3 criteria: one- it must not bias semiconductors into conduction; two- it must have a low impedance input to ignor resistances and three- be simple and low cost in design. This invention meets all three of these requirements and overcomes all the disadvantages of previous continuity testers and the full significance of the invention will be appreciated when the detailed written description is read in conjunction with the drawings.

SUMMARY OF THE INVENTION

This invention totally differs from all present continuity testers because it electronically divides its power supply voltage to approximately 0.2 volts for its probe voltage. By doing this, semiconductor junctions cannot be biased into conduction when probed and thus no current can flow through them. For comparison, a typical semiconductor, at room temperature, starts conduction at about 0.6 volts except for Schottky devices which conduct at about 0.3 volts. All present continuity testers have a probe voltage about equal to their internal battery voltage, so even a single battery cell tester would have a probe voltage of about 1.5 volts, which is 3 to 5 times too high to prevent semiconductor current flow. Since there is no semiconductor current flow at 0.2 volts with this invention, CMOS is totally protected from damaging induced test currents. By using a low impedance input circuit, the invention will not give an indication for resistances of anything above a few ohms. The invention may be powered by either battery or an AC mains operated power supply. When battery power is elected, and on/off switch is employed to prolong battery life as a constant small current is being used by the voltage divider even when the probes are not touching. Typical battery life is in excess of 1,000 hours for a single 9 volt radio type battery on one production model of this invention.

DRAWINGS

DETAILED DESCRIPTION

Figure 1:
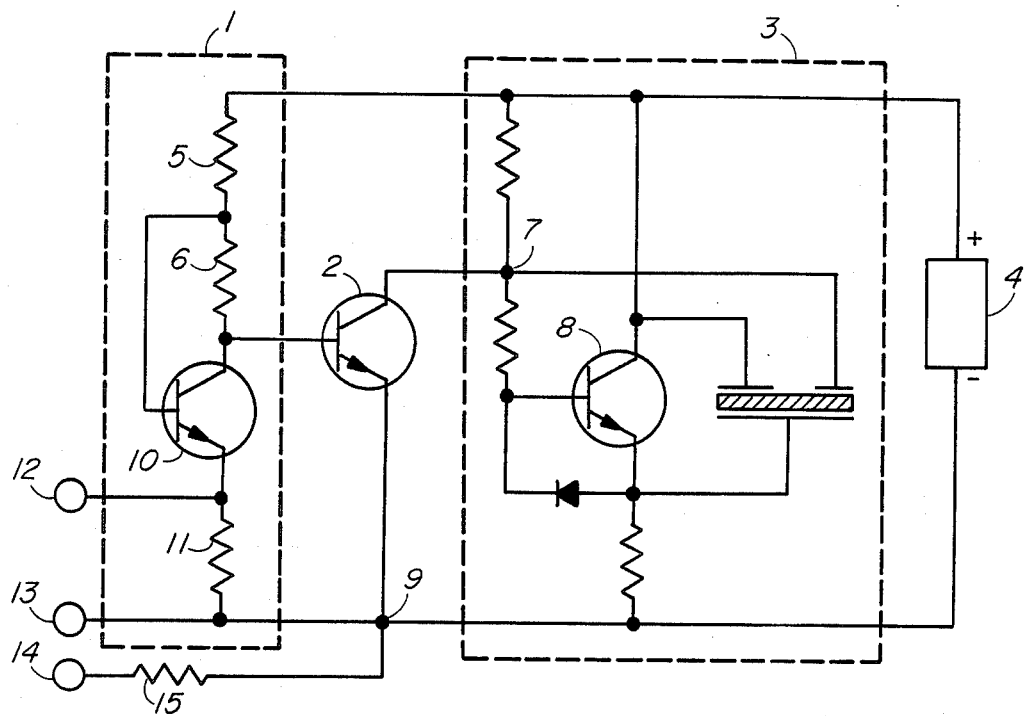
FIG. 1 is a schematic diagram of the invention's circuit.

Referring to FIG. 1, the invention consists of four circuit sections, the electronic voltage divider 1, the switch transistor 2, a piezo-electric audio oscillator 3 and a direct current power source 4. Although a piezo-electric oscillator is shown, any type of audio oscillator could be used or even a visual indication device such as a light emitting diode although in application audio indication is preferred as it allows the user to concentrate visually on where the circuit is being probed without having to look away to see if there was a response from the tester.

In operation, the piezo-electric oscillator 3 is prevented from oscillating by transistor 2 which is forward biased by resistors 5 and 6 shorting to ground 9 the bias voltage 7 necessary for transistor 8 to oscillate. Transistor 10 is also forward biased by resistors 5 and 6. The combination of resistors 5, 6 and 11 is selected to produce a voltage at room temperature of about 0.2 volts across resistor 11 and about 0.45 volts across the collector-emitter junction of transistor 10. In use, test probes 18, 19 are connected to test jacks 12, 13. Probing a low resistance path will short out resistor 11. The voltage across transistor 10 remains essentially constant and being about 0.45 volts biases transistor 2 into a non-conducting state restoring the bias to transistor 8 allowing it to oscillate. The reason for using (as an active buffer) the forward biased transistor 10 instead of another resistor for the voltage divider is that the turn-off point of transistor 2 varies so much with change in temperature, that just over the range of +32 F to +100 F, the tester's response would either self turn-on when cold, or not respond at all when hot. Use of conducting transistor 10 instead of a fixed resistor provides semi-precision temperature compensation over a wide operating range. In packaging the circuit, transistors 2 and 10 should be physically located next to each other to insure that they are always at the same temperature. For further CMOS protection, a third jack 14 is provided which connects the tester's ground 9 through a high value resistor 15 which is then grounded to the operator's workstation.

Figure 2:
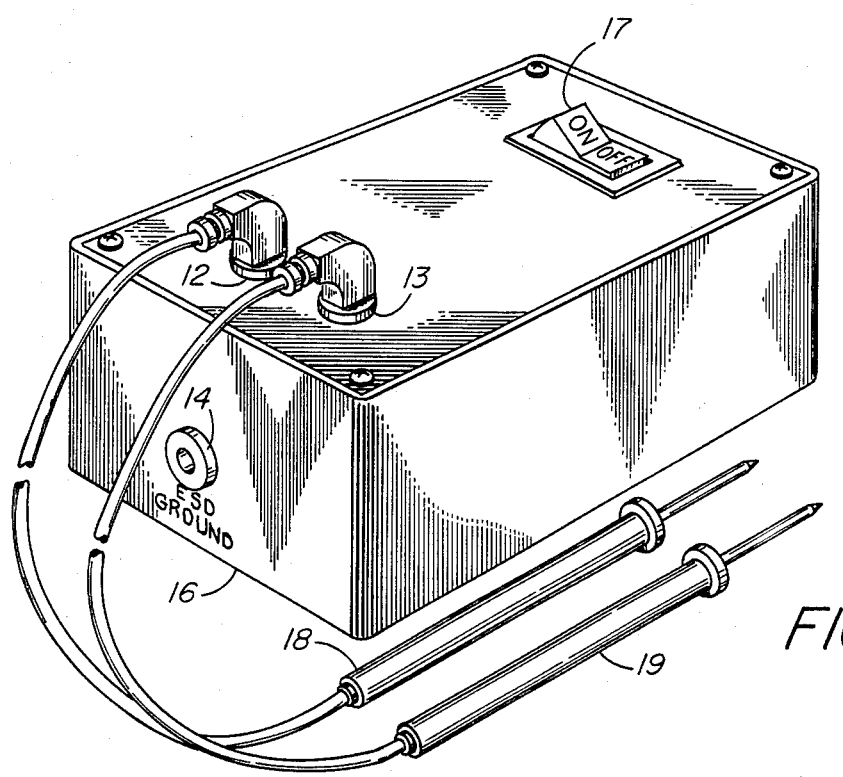
FIG. 2 shows a typical packaging of the invention.

FIG. 2 shows a typical packaging of the circuit. A housing 16 contains the circuit's components with a power switch 17 and probe jacks 12, 13 to which test probes 18, 19 are connected. A third jack 14 is connected to workstation ground.

An alternate method of housing the circuit would be to enlarge one of the probe handles sufficient to house the components eliminating one of the lead wires.

From the above description, it is apparent that this invention offers new, unique and very significant advantages over all other continuity testers for tracing electronic wiring paths on printed circuit boards and uses a minimum of inexpensive parts to generate the low probe voltage and low impedance response to resistance paths.

This invention is disclosed by way of illustration and not limitation and may be modified in many aspects all within the scope and spirit thereof:

I claim:

1. A continuity tester for tracing circuit paths by applying test voltages below any conduction threshold of the circuits under test and by sensing a continuity induced current, comprising:
   (A) indicator means (3) actuated in response to the presence of continuity;
   (B) switching means (2), controlling said indicator means, having a threshold with temperature dependency for defining continuity presence;
   (C) voltage divider means (1), defining said test voltages below any conduction threshold and providing temperature compensation for said switching means, said voltage divider means comprising:
   (AA) third resistor, in parallel with a pair of probing terminals being applied to the circuit paths being traced, receiving a biasing current;
   (BB) active buffer means (10), controlling the switching means and supplying said biasing current to said third resistor and said pair of probing terminals, said active buffer including a junction with temperature sensitivity capable of supplying temperature compensation for said switching means;
   (CC) first and second resistor means (5 and 6), supplying biasing currents to both the active buffer means and the switching means;
   wherein continuity is sensed by a change in the current of the buffer means to an extent sufficient to cross the threshold of the switching means and trigger the indicator means.

2. The continuity tester of claim 1, wherein said buffer means is a first transistor.

3. The continuity tester of claim 2, wherein said first transistor has its base terminal connected to a junction between first and second resistors.

4. The continuity tester of claim 2, wherein the switching means includes a second transistor.

5. The continuity tester of claim 4, wherein said first transistor's collector is connected to said second transistor's base.

6. The continuity tester of claim 5, wherein said second transistor's collector controls an operating bias for the indicator means.

7. The continuity tester of claim 1, wherein the voltage applied to the circuits under test is not larger than 0.3 volts.

8. In a continuity tester for tracing electronic wiring paths on printed circuit boards with components in place, the improvement comprising a voltage divider for producing an intermediate probe voltage below the level necessary to cause conduction in semiconductors comprising:
   (a) three resistors, each having two leads,
   (b) a first transistor having collector, emitter and base leads,
   (c) a two wire direct current power source having positive and negative leads,
   (d) wiring means connecting the positive lead of the power source to the first lead of the first resistor,
   (e) wiring means connecting the second lead of the first resistor to the first lead of the second resistor and to the base lead of the transistor,
   (f) wiring means connecting the second lead of the second resistor to the collector lead of the transistor,
   (g) wiring means connecting the first lead of the third resistor to the emitter of the transistor,
   (h) wiring means connecting the second lead of the third resistor to the negative lead of the power source,
   (i) two test probes with wire leads,
   (j) wiring means connecting the test leads to each lead of the third resistor; said tester further including
   (k) a second transistor having collector, emitter and base leads,
   (l) wiring means connecting the base of the second transistor to the collector of the first transistor and the emitter of the second transistor to the second lead of the third resistor,
   (m) a cooperating audio oscillator circuit,
   (n) wiring means connecting the collector of the second transistor to feedback means of the audio oscillator to inhibit the oscillator when the second transistor is in a conducting state,
   (o) the value of the three resistors so selected to cause conduction of both transistors and a voltage drop across the third resistor of less that 0.25 volts, said probe leads adapted to substantially short the third resistor by probing a low resistance to bias the second transistor to switch to a non-conducting state and restore the bias on the audio oscillator allowing it to oscillate.

9. The circuit of claim 8 wherein a high ohms value bleeder resistor is connected by wiring means to one of the probes to provide grounding means for electrostatic charges.

* * * * *